United States Patent
Park

(10) Patent No.: US 7,837,530 B2
(45) Date of Patent: Nov. 23, 2010

(54) METHOD OF SEALING AN ORGANIC LIGHT EMITTING DISPLAY BY MEANS OF A GLASS FRIT SEAL ASSEMBLY

(75) Inventor: Jin Woo Park, Yongin-si (KR)

(73) Assignee: Samsung Mobile Display Co., Ltd. (KR)

( * ) Notice: Subject to any disclaimer, the term of this patent is extended or adjusted under 35 U.S.C. 154(b) by 1090 days.

(21) Appl. No.: 11/540,008

(22) Filed: Sep. 29, 2006

(65) Prior Publication Data

US 2007/0232182 A1  Oct. 4, 2007

(30) Foreign Application Priority Data

Mar. 29, 2006  (KR) ................ 10-2006-0028571

(51) Int. Cl.
*H01J 9/00* (2006.01)
*H01J 9/26* (2006.01)
*H01J 9/40* (2006.01)

(52) U.S. Cl. .......................... 445/25; 445/24
(58) Field of Classification Search ................. 445/24, 445/25
See application file for complete search history.

(56) References Cited

U.S. PATENT DOCUMENTS

| | | |
|---|---|---|
| 3,966,449 A | 6/1976 | Foster |
| 4,105,292 A | 8/1978 | Conder et al. |
| 4,702,566 A | 10/1987 | Tukude |
| 4,826,297 A | 5/1989 | Kubo et al. |
| 4,984,059 A | 1/1991 | Kubota et al. |
| 5,808,719 A | 9/1998 | Fujiwara et al. |
| 5,811,927 A | 9/1998 | Anderson et al. |
| 5,965,907 A | 10/1999 | Huang et al. |
| 6,005,653 A | 12/1999 | Matsuzawa |
| 6,087,717 A | 7/2000 | Ano et al. |
| 6,195,142 B1 | 2/2001 | Gyotoku et al. |
| 6,210,815 B1 | 4/2001 | Ooishi |
| 6,211,938 B1 | 4/2001 | Mori |
| 6,288,487 B1 | 9/2001 | Arai |
| 6,452,323 B1 | 9/2002 | Byrum et al. |

(Continued)

FOREIGN PATENT DOCUMENTS

CN  1290121 A  4/2001

(Continued)

OTHER PUBLICATIONS

Japanese Office Action issued Sep. 8, 2009 in Japanese Patent Application 2007-011996.

(Continued)

*Primary Examiner*—Mariceli Santiago
(74) *Attorney, Agent, or Firm*—Knobbe Martens Olson & Bear LLP

(57) ABSTRACT

An organic light-emitting display device includes a bottom substrate having a pixel region and a non-pixel region. In the pixel region, organic light-emitting pixels are formed. A top substrate is bonded to the top substrate. A sealing member is provided between the non-pixel region of the substrate and the encapsulation substrate. The sealing member includes a first frit and a second frit which melts substantially easier than the first frit upon irradiation of a laser or infrared beam thereto.

20 Claims, 8 Drawing Sheets

LASER IRRIDATING

U.S. PATENT DOCUMENTS

| | | |
|---|---|---|
| 6,489,719 B1 | 12/2002 | Young et al. |
| 6,495,262 B2 | 12/2002 | Igeta |
| 6,515,417 B1 | 2/2003 | Duggal et al. |
| 6,551,724 B2 | 4/2003 | Ishii et al. |
| 6,554,672 B2 | 4/2003 | Dunham et al. |
| 6,590,337 B1 | 7/2003 | Nishikawa et al. |
| 6,603,254 B1 | 8/2003 | Ando |
| 6,605,826 B2 | 8/2003 | Yamazaki et al. |
| 6,624,572 B1 | 9/2003 | Kim et al. |
| 6,646,284 B2 | 11/2003 | Yamazaki et al. |
| 6,650,392 B2 | 11/2003 | Iwangaga et al. |
| 6,660,547 B2 | 12/2003 | Guenther |
| 6,671,029 B1 | 12/2003 | Choi |
| 6,717,052 B2 | 4/2004 | Wang et al. |
| 6,744,199 B1 | 6/2004 | Tanaka |
| 6,791,660 B1 | 9/2004 | Hayashi et al. |
| 6,831,725 B2 | 12/2004 | Niiya |
| 6,833,668 B1 | 12/2004 | Yamada et al. |
| 6,861,801 B2 | 3/2005 | Kim et al. |
| 6,878,467 B2 | 4/2005 | Chung et al. |
| 6,896,572 B2 | 5/2005 | Park et al. |
| 6,914,661 B2 | 7/2005 | Masuda et al. |
| 6,924,594 B2 | 8/2005 | Ogura et al. |
| 6,936,963 B2 | 8/2005 | Langer et al. |
| 6,956,324 B2 | 10/2005 | Yamazaki |
| 6,956,638 B2 | 10/2005 | Akiyama et al. |
| 6,965,195 B2 | 11/2005 | Yamazaki et al. |
| 6,980,275 B1 | 12/2005 | Konuma et al. |
| 6,993,537 B2 | 1/2006 | Buxton et al. |
| 6,998,776 B2 | 2/2006 | Aitken et al. |
| 7,030,558 B2 | 4/2006 | Park et al. |
| 7,098,589 B2 | 8/2006 | Erchak et al. |
| 7,112,115 B1 | 9/2006 | Yamazaki et al. |
| 7,141,925 B2 | 11/2006 | Wittmann et al. |
| 7,154,218 B2 | 12/2006 | Murakami et al. |
| 7,178,927 B2 | 2/2007 | Seo |
| 7,187,121 B2 | 3/2007 | Hasegawa et al. |
| 7,193,218 B2 | 3/2007 | Nagano |
| 7,193,364 B2 | 3/2007 | Klausmann et al. |
| 7,193,366 B2 | 3/2007 | Tomimatsu et al. |
| 7,202,602 B2 | 4/2007 | Anandan |
| 7,211,938 B2 | 5/2007 | Tanaka |
| 7,214,429 B2 | 5/2007 | Kato et al. |
| 7,255,823 B1 | 8/2007 | Guether et al. |
| 7,291,977 B2 | 11/2007 | Kim et al. |
| 7,306,346 B2 | 12/2007 | Fukuoka et al. |
| 7,317,281 B2 | 1/2008 | Hayashi et al. |
| 7,332,858 B2 | 2/2008 | Nomura et al. |
| 7,342,357 B2 | 3/2008 | Sakano et al. |
| 7,344,901 B2 | 3/2008 | Hawtof et al. |
| 7,359,021 B2 | 4/2008 | Ota et al. |
| 7,371,143 B2 | 5/2008 | Becken et al. |
| 7,393,257 B2 | 7/2008 | Spencer et al. |
| 7,407,423 B2 | 8/2008 | Aitken et al. |
| 7,423,375 B2 | 9/2008 | Guenther et al. |
| 7,425,166 B2 | 9/2008 | Burt et al. |
| 7,425,518 B2 | 9/2008 | Yoshida et al. |
| 7,426,010 B2 | 9/2008 | Lee et al. |
| 7,452,738 B2 | 11/2008 | Hayashi et al. |
| 7,474,375 B2 | 1/2009 | Kwak et al. |
| 7,498,186 B2 | 3/2009 | Lee |
| 7,528,544 B2 | 5/2009 | Kwak et al. |
| 7,537,504 B2 | 5/2009 | Becken et al. |
| 7,514,280 B2 | 7/2009 | Lee |
| 7,564,185 B2 | 7/2009 | Song et al. |
| 7,579,203 B2 | 8/2009 | Yamazaki et al. |
| 7,579,220 B2 | 8/2009 | Ohnuma et al. |
| 7,586,254 B2 | 9/2009 | Kwak et al. |
| 7,597,603 B2 | 10/2009 | Becken et al. |
| 2003/0066311 A1 | 4/2003 | Li et al. |
| 2003/0077396 A1 | 4/2003 | Lecompte et al. |
| 2004/0075380 A1 | 4/2004 | Takemoto et al. |
| 2004/0104655 A1 | 6/2004 | Kodera et al. |
| 2004/0169033 A1 | 9/2004 | Kuibira et al. |
| 2004/0169174 A1 | 9/2004 | Huh et al. |
| 2004/0206953 A1 | 10/2004 | Morena et al. |
| 2005/0127820 A1 | 6/2005 | Yamazaki et al. |
| 2005/0233885 A1 | 10/2005 | Yoshida et al. |
| 2005/0248270 A1 | 11/2005 | Ghosh et al. |
| 2005/0275342 A1 | 12/2005 | Yanagawa |
| 2006/0082298 A1 | 4/2006 | Becken et al. |
| 2006/0084348 A1 | 4/2006 | Becken et al. |
| 2006/0284556 A1 | 12/2006 | Tremel et al. |
| 2006/0290261 A1 | 12/2006 | Sawai et al. |
| 2007/0120478 A1 | 5/2007 | Lee et al. |
| 2007/0170324 A1 | 7/2007 | Lee et al. |
| 2007/0170423 A1 | 7/2007 | Choi et al. |
| 2007/0170605 A1 | 7/2007 | Lee et al. |
| 2007/0170839 A1 | 7/2007 | Choi et al. |
| 2007/0170845 A1 | 7/2007 | Choi et al. |
| 2007/0170850 A1 | 7/2007 | Choi et al. |
| 2007/0170855 A1 | 7/2007 | Choi et al. |
| 2007/0170857 A1 | 7/2007 | Choi et al. |
| 2007/0170859 A1 | 7/2007 | Choi et al. |
| 2007/0170860 A1 | 7/2007 | Choi et al. |
| 2007/0170861 A1 | 7/2007 | Lee et al. |
| 2007/0171637 A1 | 7/2007 | Choi |
| 2007/0172971 A1 | 7/2007 | Boroson |
| 2007/0173167 A1 | 7/2007 | Choi et al. |
| 2007/0176549 A1 | 8/2007 | Park |
| 2007/0177069 A1 | 8/2007 | Lee |
| 2007/0197120 A1 | 8/2007 | Lee |
| 2008/0074036 A1 | 3/2008 | Wang et al. |

FOREIGN PATENT DOCUMENTS

| | | | |
|---|---|---|---|
| CN | 1438825 | | 8/2003 |
| CN | 1551686 | A | 12/2004 |
| CN | 1577413 | | 2/2005 |
| CN | 161636 | | 5/2005 |
| CN | 1212662 | | 7/2005 |
| CN | 1670570 | | 9/2005 |
| JP | 03037933 | A * | 2/1991 |
| JP | 04-147217 | | 5/1992 |
| JP | 04301879 | A * | 10/1992 |
| JP | 06-34983 | | 2/1994 |
| JP | 06-337429 | | 10/1994 |
| JP | 07-74583 | | 3/1995 |
| JP | 09-258671 | | 3/1997 |
| JP | 10-74583 | | 3/1998 |
| JP | 10-161137 | | 6/1998 |
| JP | 63-163423 | | 7/1998 |
| JP | 10-201585 | | 8/1998 |
| JP | 11-007031 | | 1/1999 |
| JP | 11-202349 | | 7/1999 |
| JP | 2001-022293 | | 1/2001 |
| JP | 2001-052858 | | 2/2001 |
| JP | 2001-55527 | | 2/2001 |
| JP | 2001-203076 | | 2/2001 |
| JP | 2001-110564 | | 4/2001 |
| JP | 2001-230072 | | 8/2001 |
| JP | 2001-319775 | | 11/2001 |
| JP | 2002 020169 | | 1/2002 |
| JP | 2002-93576 | | 3/2002 |
| JP | 2002-100472 | | 4/2002 |
| JP | 2002 117777 | | 4/2002 |
| JP | 2002 170664 | | 6/2002 |
| JP | 2002-216951 | | 8/2002 |
| JP | 2002-280169 | | 9/2002 |
| JP | 2002-318547 | | 10/2002 |
| JP | 2001-324662 | | 11/2002 |
| JP | 2002-359070 | | 12/2002 |
| JP | 2003-123966 | | 4/2003 |
| JP | 2003-228302 | | 8/2003 |

| | | |
|---|---|---|
| JP | 2003 243160 | 8/2003 |
| JP | 2003 297552 | 10/2003 |
| JP | 2003-332061 | 11/2003 |
| JP | 2004 29552 | 1/2004 |
| JP | 2004 070351 | 3/2004 |
| JP | 04-151656 | 5/2004 |
| JP | 2004 303733 | 10/2004 |
| JP | 2004 319103 | 11/2004 |
| JP | 2005-049808 | 2/2005 |
| JP | 2005-71984 | 3/2005 |
| JP | 2005-112676 | 4/2005 |
| JP | 2005-510831 | 4/2005 |
| JP | 2005-123089 | 5/2005 |
| JP | 2005 158672 | 6/2005 |
| JP | 2005 190683 | 7/2005 |
| JP | 2005 251415 | 9/2005 |
| JP | 2005 258405 | 9/2005 |
| JP | 2005 340020 | 12/2005 |
| JP | 2006 524419 | 10/2006 |
| KR | 10-1995-0009817 | 4/1995 |
| KR | 10-1998-0017583 | 6/1998 |
| KR | 10-2000-0045292 | 7/2000 |
| KR | 10-2001-0084380 | 9/2001 |
| KR | 10-2002-0051153 | 6/2002 |
| KR | 10-2003-0044656 | 6/2003 |
| KR | 10-2004-0011138 | 2/2004 |
| KR | 10-2005-070543 | 7/2005 |
| KR | 10-2005-0112318 | 11/2005 |
| KR | 10-2005-0115408 | 12/2005 |
| KR | 10-2006-0005369 | 1/2006 |
| TW | 569166 | 1/2004 |
| TW | I227094 | 1/2005 |
| TW | I228686 | 3/2005 |
| TW | I237218 | 8/2005 |
| TW | 200541379 | 12/2005 |
| TW | 200541382 | 12/2005 |
| WO | WO 02/21557 | 3/2002 |
| WO | WO 03/005774 | 1/2003 |
| WO | WO 2004-095597 | 4/2004 |
| WO | WO 2004/094331 | 11/2004 |
| WO | WO 2004/112160 | 12/2004 |
| WO | WO 2005050751 A2 * | 6/2005 |

OTHER PUBLICATIONS

Japan Office Action dated Jul. 28, 2009 of the Japanese Patent Application No. 2006-153567.
Japan Office Action dated Jul. 28, 2009 of the Japanese Patent Application No. 2006 178508.
Japan Office Action dated Jul. 14, 2009 of the Japanese Patent Application No. 2006-151960.
Japan Office Action dated Jul. 14, 2009 of the Japanese Patent Application No. 2006-165210.
Chinese Office Action in Patent Application No. 200710000143.2 dated Sep. 26, 2008.
Chinese Office Action issued Oct. 10, 2008 in Patent Application No. 2007100040808.
Chinese Office Action issued Aug. 1, 2008 in Patent Application No. 200710001301.6.
Chinese Office Action issued Oct. 10, 2008 in Patent Application No. 200710003941.0.
Chinese Office Action issued Oct. 10, 2008 in Patent Application No. 200710001782.0.
Chinese Office Action issued on Aug. 1, 2008 in Patent Application No. 2007100015717.
Chinese Office Action Issued Dec. 19, 2008 in Patent Application No. 2007100072531.
Chinese Rejection Decision issued May 8, 2009 in Patent Application No. 200710004080.8.
Chinese Office Action issued Jan. 8, 2010 in Patent Application No. 200710003941.0.
European Search Report from European Patent Application No. 07101294.2 dated Jun. 6, 2007.
European Search Report from European Patent Application No. 07101295.9 dated May 24, 2007.
Japanese Office Action dated Dec. 1, 2009 for Japanese Patent Application No. 2006-193033.
Japanese Office Action mailed Jun. 30, 2009 for Japanese Application No. 2006-222065.
Japanese Office Action dated Jul. 28, 2009 for Patent Application No. 2006-153567.
Japanese Office Action for Patent Application No. 2006-1930232 mailed May 19, 2009.
Japanese Office Action issued May 19, 2009 in Patent Application No. 2006-189628.
Japanese Office Action issued Oct. 20, 2009 in Japanese Patent Application No. 2006-189628.
Japanese Office Action issued on Oct. 27, 2009 in Patent Application No. 2006-256002.
Japanese Office Action re Patent Application No. 2006-193034 mailed May 19, 2009.
Korean Notice of Allowance issued Aug. 2, 2007 in Patent Application No. 10-2006-0016188.
Korean Notice of Allowance issued Jul. 3, 2007 in Patent Application No. 10-2006-0035455.
Korean Office Action from Patent Application No. 10-2006-0006148 dated Sep. 26, 2006.
Korean Office Action from Patent Application No. 10-2006-0007890, dated Sep. 26, 2006.
Korean Office Action from Patent Application No. 10-2006-0007963, dated Sep. 26, 2006.
Korean Office Action issued Feb. 12, 2007 in Patent Application No. 10-2006-0035455.
Taiwanese Office Action issued Jan. 18, 2010 in Application No. 95145107.
U.S. Office Action dated Feb. 2, 2009 in U.S. Appl. No. 11/529,916.
U.S. Office Action dated Apr. 3, 2009 in U.S. Appl. No. 11/529,891.
U.S. Office Action dated Apr. 3, 2009 in U.S. Appl. No. 11/541,055.
U.S. Office Action dated Mar. 29, 2010 in U.S. Appl. No. 11/541,055.
U.S. Office Action dated Aug. 19, 2009 in U.S. Appl. No. 11/529,914.
U.S. Office Action dated Dec. 30, 2009 in U.S. Appl. No. 11/541,139.
U.S. Office Action dated Nov. 5, 2009 in U.S. Appl. No. 11/541,047.
U.S. Office Action dated Nov. 28, 2007 in U.S. Appl. No. 11/540,150.
U.S. Office Action dated Aug. 21, 2008 in U.S. Appl. No. 11/540,150.
U.S. Office Action dated Nov. 15, 2007 in U.S. Appl. No. 11/541,009.
U.S. Office Action dated Jun. 19, 2008 in U.S. Appl. No. 11/541,009.
U.S. Office Action dated Dec. 3, 2008 in U.S. Appl. No. 11/541,009.
U.S. Office Action dated Apr. 30, 2009 in U.S. Appl. No. 11/540,151.
U.S. Office Action dated Feb. 11, 2009 in U.S. Appl. No. 11/529,883.
U.S. Office Action dated Jul. 17, 2009 in U.S. Appl. No. 11/529,883.
U.S. Office Action dated Dec. 30, 2009 in U.S. Appl. No. 11/541,048.
U.S. Office Action dated Dec. 8, 2008 in U.S. Appl. No. 11/540,021.
U.S. Office Action dated Apr. 27, 2009 in U.S. Appl. No. 11/540,021.
U.S. Office Action dated Feb. 19, 2009 in U.S. Appl. No. 11/540,024.
U.S. Office Action dated May 4, 2009 in U.S. Appl. No. 11/529,995.
U.S. Office Action dated May 8, 2009 in U.S. Appl. No. 11/540,149.

* cited by examiner

UV IRRADIATING

LASER IRRIDATING

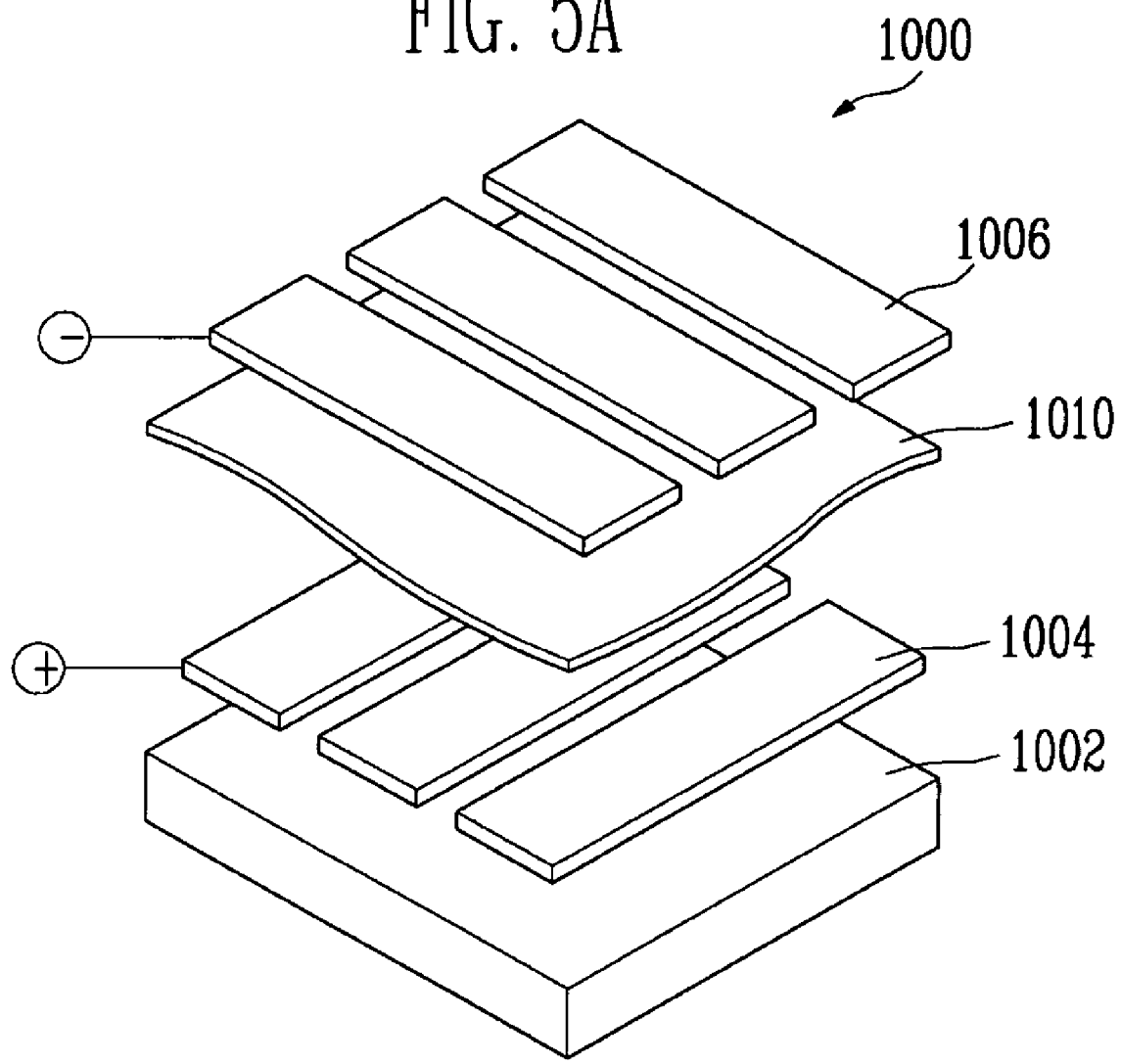

METHOD OF SEALING AN ORGANIC LIGHT EMITTING DISPLAY BY MEANS OF A GLASS FRIT SEAL ASSEMBLY

CROSS-REFERENCE TO RELATED APPLICATIONS

This application claims the benefit of Korean Patent Application No. 10-2006-0028571, filed on Mar. 29, 2006, in the Korean Intellectual Property Office, the disclosure of which is incorporated herein by reference in its entirety. This application is related to and incorporates herein by reference the entire contents of the following concurrently filed applications:

| Title | Atty. Docket No. | Filing Date | Application No. |
|---|---|---|---|
| ORGANIC LIGHT-EMITTING DISPLAY DEVICE AND METHOD OF FABRICATING THE SAME | SDISHN.043AUS | | |
| ORGANIC LIGHT-EMITTING DISPLAY DEVICE AND METHOD OF MANUFACTURING THE SAME | SDISHN.045AUS | | |
| ORGANIC LIGHT EMITTING DISPLAY DEVICE | SDISHN.048AUS | | |
| ORGANIC LIGHT-EMITTING DISPLAY DEVICE WITH FRIT SEAL AND REINFORCING STRUCTURE | SDISHN.051AUS | | |
| ORGANIC LIGHT EMITTING DISPLAY DEVICE METHOD OF FABRICATING THE SAME | SDISHN.052AUS | | |
| ORGANIC LIGHT EMITTING DISPLAY AND METHOD OF FABRICATING THE SAME | SDISHN.053AUS | | |
| ORGANIC LIGHT-EMITTING DISPLAY DEVICE WITH FRIT SEAL AND REINFORCING STRUCTURE BONDED TO FRAME | SDISHN.054AUS | | |
| METHOD FOR PACKAGING ORGANIC LIGHT EMITTING DISPLAY WITH FRIT SEAL AND REINFORCING STURUTURE | SDISHN.055AUS | | |
| METHOD FOR PACKAGING ORGANIC LIGHT EMITTING DISPLAY WITH FRIT SEAL AND REINFORCING STURUTURE | SDISHN.056AUS | | |
| ORGANIC LIGHT EMITTING DISPLAY AND FABRICATING METHOD OF THE SAME | SDISHN.061AUS | | |
| ORGANIC LIGHT-EMITTING DISPLAY AND METHOD OF MAKING THE SAME | SDISHN.062AUS | | |
| ORGANIC LIGHT EMITTING DISPLAY AND FABRICATING METHOD OF THE SAME | SDISHN.063AUS | | |
| ORGANIC LIGHT EMITTING DISPLAY DEVICE AND MANUFACTURING METHOD THEREOF | SDISHN.064AUS | | |
| ORGANIC LIGHT-EMITTING DISPLAY DEVICE AND MANUFACTURING METHOD OF THE SAME | SDISHN.066AUS | | |
| ORGANIC LIGHT EMITTING DISPLAY AND FABRICATING METHOD OF THE SAME | SDISHN.067AUS | | |
| ORGANIC LIGHT EMITTING DISPLAY AND METHOD OF FABRICATING THE SAME | SDISW.017AUS | | |
| ORGANIC LIGHT EMITTING DISPLAY DEVICE METHOD OF FABRICATING THE SAME | SDISW.018AUS | | |
| ORGANIC LIGHT EMITTING DISPLAY AND METHOD OF FABRICATING THE SAME | SDISW.020AUS | | |

BACKGROUND

1. Field of the Invention

The present invention relates to organic light-emitting display devices and, more particularly, to packaging such devices.

2. Discussion of Related Art

An organic light-emitting display device is one of flat display devices wherein an organic light-emitting layer is positioned between electrodes opposed to each other and voltage is then applied between the electrodes so that electrons injected from one electrode are coupled with a hole injected from the other electrode in the organic light-emitting layer, and by this coupling light-emitting molecules in the light-emitting layer are once excited and returned to a base state, thereby, light-emitting the emitted energy as light. The organic light-emitting display device according to such a light-emitting principle has excellent visibility, light weight and thinness and can further be driven with low voltage and therefore, has been spotlighted as a next generation display. U.S. Pat. No. 6,998,776 B2 discloses that an organic light-emitting display includes a first substrate plate, a second substrate plate and a frit connecting the plates.

SUMMARY OF CERTAIN INVENTIVE ASPECTS

An aspect of the invention provides a method of making an organic light emitting display device, which may comprise: providing a first substrate and a first frit bonded to the first substrate; providing a second substrate and an array of organic light emitting pixels formed on the second substrate, the second substrate made of a single layer or multiple layers; arranging the first substrate and the second substrate so as to oppose each other and interpose the array therebetween; interposing a second frit between the first frit and the second substrate, the second frit forming a closed loop surrounding the array, the second frit is configured to melt substantially easier than the first frit upon irradiation of a laser or infrared beam thereto; and bonding the second frit to the first frit and to the second substrate, thereby forming an integrated frit seal interposed between the first and second substrate wherein the frit seal, the first substrate and the second substrate together define an enclosed space in which the array is located.

In the foregoing method, bonding may comprise melting and solidifying at least part of the second frit. Melting may comprise irradiating a laser or infrared beam to the second frit. The laser or infrared beam may reach the first frit, and wherein the first frit may substantially melt substantially less than the second frit. Interposing the second frit may comprise placing the second frit on the first frit. Each of the first and second frits may comprise a light-to-heat conversion material configured to generate heat upon receiving the laser or infrared beam, and wherein the second frit may comprise an amount of the light-to-heat conversion material substantially more than the first frit. The second frit may comprise a light-to-heat conversion material configured to generate heat upon receiving the laser or infrared beam, and wherein the first frit may be substantially free of light-to-heat conversion material. The first frit may be substantially transparent. The second frit may be substantially non-transparent.

Still in the foregoing method, wherein the first frit may comprise a first end facing the second substrate, the second frit may comprise a second end facing the first substrate, wherein the first end may have a first width perpendicular to the shortest imaginary line interconnecting the first and second substrates in a plane perpendicular to an elongation of the frit seal, and wherein the second end may have a second width in the same direction, wherein the first width may be greater than the second width. The first frit may comprise a first end facing the second substrate, the second frit may comprise a second end facing the first substrate, wherein the first frit may have a first height from the first substrate to the first end in a direction parallel to the shortest imaginary line interconnecting the first and second substrates in a plane perpendicular to an elongation of the frit seal, wherein the second frit may have a second height from the second substrate to the second end in the same direction, wherein the first height may be greater than the second height. Providing the first substrate and the first frit may comprise bonding the first frit to the first substrate. Bonding may comprise baking the first substrate and the first frit in contact with the first substrate, whereby at least part of the first frit melts and solidifies so as to bond to the first substrate. The array and the first substrate may form a gap therebetween. The first frit may have a volume substantially greater than that of the second frit.

Further in the foregoing method, the method may further comprise forming a structure extending along at least part of the frit seal, wherein the structure is interposed between and interconnects the first and second substrates, and wherein the structure is located outside or inside the enclosed space. Forming the structure may comprise interposing a curable material between the first and second substrates; and curing the curable material thereby forming the structure interconnecting the first and second structures. The method may further comprise forming a first structure and a second structure, each of which is interposed between and interconnects the first and second substrates, wherein the first structure extends along the frit seal inside the enclosed space, and wherein the second structure extends along the frit seal outside the enclosed space. The method may further comprise forming a structure extending along the frit seal and located inside or outside the enclosed space, wherein the structure comprises a portion interposed between and interconnects the first frit and the second substrate. The structure may comprise another portion that is not interposed between the first frit of the frit seal and the first substrates. Forming the structure may comprise interposing a curable material between the first frit and the second substrate, and curing the curable material thereby forming the structure interconnecting the first frit and the second structure. The method may further comprise forming a first structure and a second structure, each of which extends along the frit seal inside or outside the enclosed space, wherein the first structure is interposed between and interconnects the first and second substrates, wherein the second structure is interposed between and interconnects the first frit and the second substrate. Each of the first and second frits may comprise one or more materials selected from the group consisting of magnesium oxide (MgO), calcium oxide (CaO), barium oxide (BaO), lithium oxide ($Li_2O$), sodium oxide ($Na_2O$), potassium oxide ($K_2O$), boron oxide ($B_2O_3$), vanadium oxide ($V_2O_5$), zinc oxide (ZnO), tellurium oxide ($TeO_2$), aluminum oxide ($Al_2O_3$), silicon dioxide ($SiO_2$), lead oxide (PbO), tin oxide (SnO), phosphorous oxide ($P_2O_5$), ruthenium oxide ($Ru_2O$), rubidium oxide ($Rb_2O$), rhodium oxide ($Rh_2O$), ferrite oxide ($Fe_2O_3$), copper oxide (CuO), titanium oxide ($TiO_2$), tungsten oxide ($WO_3$), bismuth oxide ($Bi_2O_3$), antimony oxide ($Sb_2O_3$), lead-borate glass, tin-phosphate glass, vanadate glass, and borosilicate.

Another aspect of the present invention provides an organic light-emitting display device, which may comprise: a substrate comprising a pixel region and a non-pixel region on the side thereof wherein in the pixel region an organic light-emitting diode is configured including an organic light-emitting layer between a first electrode and a second electrode and the non-pixel region is formed in the extension of the pixel region; an encapsulation substrate bonded to one region including the pixel region of the first substrate; encapsulating member provided between the non-pixel region of the substrate and the encapsulation substrate and comprising a first frit layer of transparent material and a second frit layer of opaque material to be melted by irradiating laser or infrared rays; and supplement material configured of resin formed at the lateral portion at the encapsulating member.

Still another aspect of the present invention provides a preparing method of an organic light-emitting display device comprising a substrate comprising a pixel region including an organic light-emitting diode and a non-pixel region formed in the extension of the pixel region, and an encapsulation substrate for sealing at least pixel region of the substrate, which may comprise: a first step for applying a first frit of transparent material to one region of the encapsulation substrate opposed to the non-pixel region in a state of a frit; a second step for sintering the first frit at a first temperature; a third step for applying a second frit of opaque material to one region on the first frit in a state of a frit; a fourth step for sintering the second frit at a second temperature; a fifth step for applying supplement material made of resin to at least one lateral portion of lateral portions of the encapsulating member; a sixth step for bonding an encapsulation substrate to the substrate so that the encapsulation substrate seals at least pixel region of the substrate; a seventh step for primarily adhering the encapsulation substrate to the substrate by curing the resin applied to the supplement material; and an eighth step for secondarily adhering the encapsulation substrate to the substrate by curing the encapsulating member by irradiating laser or infrared rays to the encapsulating member.

BRIEF DESCRIPTION OF THE DRAWINGS

These and other aspects and advantages of the invention will become apparent and more readily appreciated from the following description of the embodiments, taken in conjunction with the accompanying drawings of which:

FIG. 5A is a schematic exploded view of a passive matrix type organic light emitting display device in accordance with one embodiment;

DETAILED DESCRIPTION OF EMBODIMENTS

Hereinafter, embodiments according to the present invention will be described with reference to the accompanying drawings.

An organic light emitting display (OLED) is a display device comprising an array of organic light emitting diodes. Organic light emitting diodes are solid state devices which include an organic material and are adapted to generate and emit light when appropriate electrical potentials are applied.

Figure 5B:
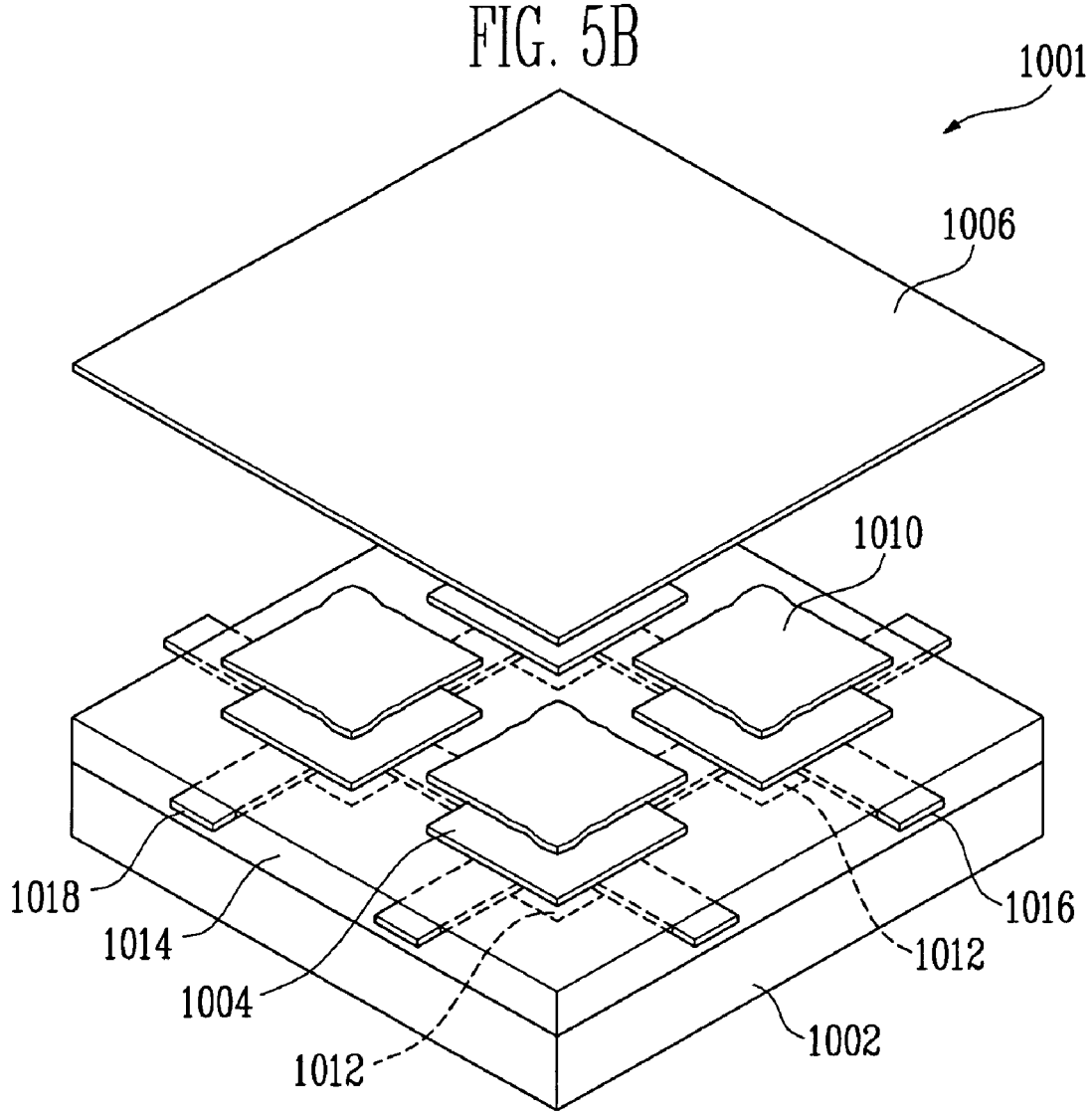
FIG. 5B is a schematic exploded view of an active matrix type organic light emitting display device in accordance with one embodiment.

OLEDs can be generally grouped into two basic types dependent on the arrangement with which the stimulating electrical current is provided. FIG. 5A schematically illustrates an exploded view of a simplified structure of a passive matrix type OLED 1000. FIG. 5B schematically illustrates a simplified structure of an active matrix type OLED 1001. In both configurations, the OLED 1000, 1001 includes OLED pixels built over a substrate 1002, and the OLED pixels include an anode 1004, a cathode 1006 and an organic layer 1010. When an appropriate electrical current is applied to the anode 1004, electric current flows through the pixels and visible light is emitted from the organic layer.

Referring to FIG. 5A, the passive matrix OLED (PMOLED) design includes elongate strips of anode 1004 arranged generally perpendicular to elongate strips of cathode 1006 with organic layers interposed therebetween. The intersections of the strips of cathode 1006 and anode 1004 define individual OLED pixels where light is generated and emitted upon appropriate excitation of the corresponding strips of anode 1004 and cathode 1006. PMOLEDs provide the advantage of relatively simple fabrication.

Referring to FIG. 5B, the active matrix OLED (AMOLED) includes local driving circuits 1012 arranged between the substrate 1002 and an array of OLED pixels. An individual pixel of AMOLEDs is defined between the common cathode 1006 and an anode 1004, which is electrically isolated from other anodes. Each driving circuit 1012 is coupled with an anode 1004 of the OLED pixels and further coupled with a data line 1016 and a scan line 1018. In embodiments, the scan lines 1018 supply scan signals that select rows of the driving circuits, and the data lines 1016 supply data signals for particular driving circuits. The data signals and scan signals stimulate the local driving circuits 1012, which excite the anodes 1004 so as to emit light from their corresponding pixels.

In the illustrated AMOLED, the local driving circuits 1012, the data lines 1016 and scan lines 1018 are buried in a planarization layer 1014, which is interposed between the pixel array and the substrate 1002. The planarization layer 1014 provides a planar top surface on which the organic light emitting pixel array is formed. The planarization layer 1014 may be formed of organic or inorganic materials, and formed of two or more layers although shown as a single layer. The local driving circuits 1012 are typically formed with thin film transistors (TFT) and arranged in a grid or array under the OLED pixel array. The local driving circuits 1012 may be at least partly made of organic materials, including organic TFT. AMOLEDs have the advantage of fast response time improving their desirability for use in displaying data signals. Also, AMOLEDs have the advantages of consuming less power than passive matrix OLEDs.

Referring to common features of the PMOLED and AMOLED designs, the substrate 1002 provides structural support for the OLED pixels and circuits. In various embodiments, the substrate 1002 can comprise rigid or flexible materials as well as opaque or transparent materials, such as plastic, glass, and/or foil. As noted above, each OLED pixel or diode is formed with the anode 1004, cathode 1006 and organic layer 1010 interposed therebetween. When an appropriate electrical current is applied to the anode 1004, the cathode 1006 injects electrons and the anode 1004 injects holes. In certain embodiments, the anode 1004 and cathode 1006 are inverted; i.e., the cathode is formed on the substrate 1002 and the anode is opposingly arranged.

Interposed between the cathode 1006 and anode 1004 are one or more organic layers. More specifically, at least one emissive or light emitting layer is interposed between the cathode 1006 and anode 1004. The light emitting layer may comprise one or more light emitting organic compounds. Typically, the light emitting layer is configured to emit visible light in a single color such as blue, green, red or white. In the illustrated embodiment, one organic layer 1010 is formed between the cathode 1006 and anode 1004 and acts as a light emitting layer. Additional layers, which can be formed between the anode 1004 and cathode 1006, can include a hole transporting layer, a hole injection layer, an electron transporting layer and an electron injection layer.

Hole transporting and/or injection layers can be interposed between the light emitting layer 1010 and the anode 1004. Electron transporting and/or injecting layers can be interposed between the cathode 1006 and the light emitting layer 1010. The electron injection layer facilitates injection of electrons from the cathode 1006 toward the light emitting layer 1010 by reducing the work function for injecting electrons from the cathode 1006. Similarly, the hole injection layer facilitates injection of holes from the anode 1004 toward the light emitting layer 1010. The hole and electron transporting layers facilitate movement of the carriers injected from the respective electrodes toward the light emitting layer.

In some embodiments, a single layer may serve both electron injection and transportation functions or both hole injection and transportation functions. In some embodiments, one or more of these layers are lacking. In some embodiments, one or more organic layers are doped with one or more materials that help injection and/or transportation of the carriers. In embodiments where only one organic layer is formed between the cathode and anode, the organic layer may include not only an organic light emitting compound but also certain functional materials that help injection or transportation of carriers within that layer.

There are numerous organic materials that have been developed for use in these layers including the light emitting layer. Also, numerous other organic materials for use in these layers are being developed. In some embodiments, these organic materials may be macromolecules including oligomers and polymers. In some embodiments, the organic materials for these layers may be relatively small molecules. The skilled artisan will be able to select appropriate materials for each of these layers in view of the desired functions of the individual layers and the materials for the neighboring layers in particular designs.

In operation, an electrical circuit provides appropriate potential between the cathode 1006 and anode 1004. This results in an electrical current flowing from the anode 1004 to the cathode 1006 via the interposed organic layer(s). In one embodiment, the cathode 1006 provides electrons to the adjacent organic layer 1010. The anode 1004 injects holes to the organic layer 1010. The holes and electrons recombine in the organic layer 1010 and generate energy particles called "excitons." The excitons transfer their energy to the organic light emitting material in the organic layer 1010, and the energy is used to emit visible light from the organic light emitting material. The spectral characteristics of light generated and emitted by the OLED 1000, 1001 depend on the nature and composition of organic molecules in the organic layer(s). The composition of the one or more organic layers can be selected to suit the needs of a particular application by one of ordinary skill in the art.

OLED devices can also be categorized based on the direction of the light emission. In one type referred to as "top emission" type, OLED devices emit light and display images through the cathode or top electrode 1006. In these embodiments, the cathode 1006 is made of a material transparent or at least partially transparent with respect to visible light. In certain embodiments, to avoid losing any light that can pass through the anode or bottom electrode 1004, the anode may be made of a material substantially reflective of the visible light. A second type of OLED devices emits light through the anode or bottom electrode 1004 and is called "bottom emission" type. In the bottom emission type OLED devices, the anode 1004 is made of a material which is at least partially transparent with respect to visible light. Often, in bottom emission type OLED devices, the cathode 1006 is made of a material substantially reflective of the visible light. A third type of OLED devices emits light in two directions, e.g. through both anode 1004 and cathode 1006. Depending upon the direction(s) of the light emission, the substrate may be formed of a material which is transparent, opaque or reflective of visible light.

Figure 5C:
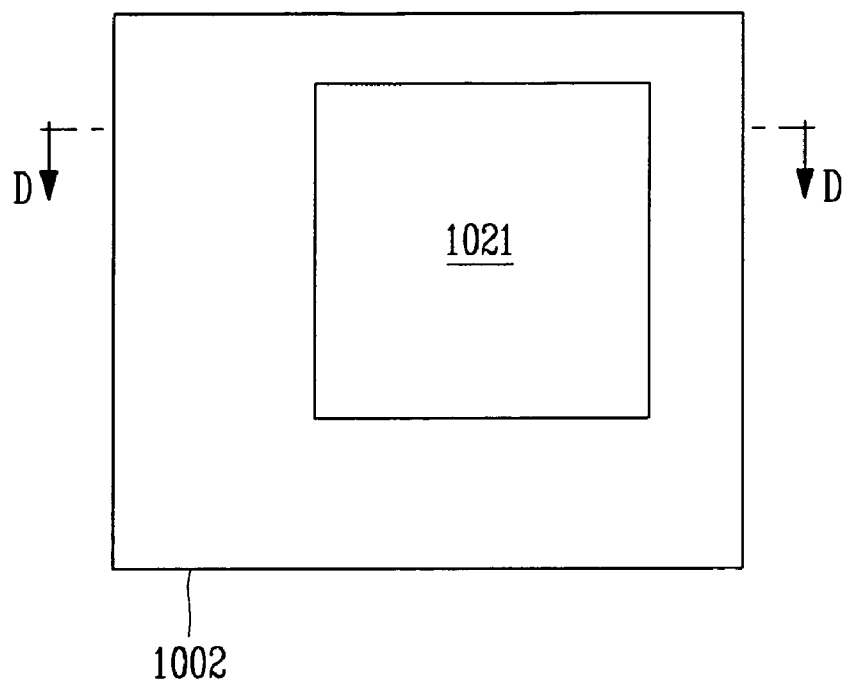
FIG. 5C is a schematic top plan view of an organic light emitting display in accordance with one embodiment.

In many embodiments, an OLED pixel array 1021 comprising a plurality of organic light emitting pixels is arranged over a substrate 1002 as shown in FIG. 5C. In embodiments, the pixels in the array 1021 are controlled to be turned on and off by a driving circuit (not shown), and the plurality of the pixels as a whole displays information or image on the array 1021. In certain embodiments, the OLED pixel array 1021 is arranged with respect to other components, such as drive and control electronics to define a display region and a non-display region. In these embodiments, the display region refers to the area of the substrate 1002 where OLED pixel array 1021 is formed. The non-display region refers to the remaining areas of the substrate 1002. In embodiments, the non-display region can contain logic and/or power supply circuitry. It will be understood that there will be at least portions of control/drive circuit elements arranged within the display region. For example, in PMOLEDs, conductive components will extend into the display region to provide appropriate potential to the anode and cathodes. In AMOLEDs, local driving circuits and data/scan lines coupled with the driving circuits will extend into the display region to drive and control the individual pixels of the AMOLEDs.

Figure 5D:
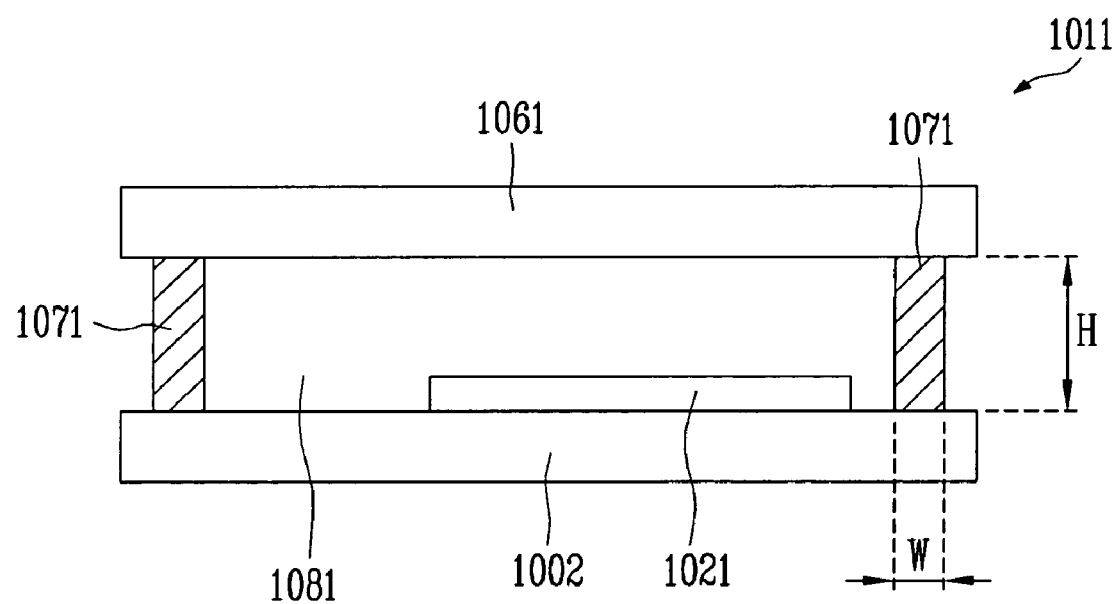
FIG. 5D is a cross-sectional view of the organic light emitting display of FIG. 5C, taken along the line d-d.

One design and fabrication consideration in OLED devices is that certain organic material layers of OLED devices can suffer damage or accelerated deterioration from exposure to water, oxygen or other harmful gases. Accordingly, it is generally understood that OLED devices be sealed or encapsulated to inhibit exposure to moisture and oxygen or other harmful gases found in a manufacturing or operational environment. FIG. 5D schematically illustrates a cross-section of an encapsulated OLED device 1011 having a layout of FIG. 5C and taken along the line d-d of FIG. 5C. In this embodiment, a generally planar top plate or substrate 1061 engages with a seal 1071 which further engages with a bottom plate or substrate 1002 to enclose or encapsulate the OLED pixel array 1021. In other embodiments, one or more layers are formed on the top plate 1061 or bottom plate 1002, and the seal 1071 is coupled with the bottom or top substrate 1002, 1061 via such a layer. In the illustrated embodiment, the seal 1071 extends along the periphery of the OLED pixel array 1021 or the bottom or top plate 1002, 1061.

In embodiments, the seal 1071 is made of a frit material as will be further discussed below. In various embodiments, the top and bottom plates 1061, 1002 comprise materials such as plastics, glass and/or metal foils which can provide a barrier to passage of oxygen and/or water to thereby protect the OLED pixel array 1021 from exposure to these substances. In embodiments, at least one of the top plate 1061 and the bottom plate 1002 are formed of a substantially transparent material.

To lengthen the life time of OLED devices 1011, it is generally desired that seal 1071 and the top and bottom plates 1061, 1002 provide a substantially non-permeable seal to oxygen and water vapor and provide a substantially hermetically enclosed space 1081. In certain applications, it is indicated that the seal 1071 of a frit material in combination with the top and bottom plates 1061, 1002 provide a barrier to oxygen of less than approximately $10^{-3}$ cc/m$^2$-day and to water of less than $10^{-6}$ g/m$^2$-day. Given that some oxygen and moisture can permeate into the enclosed space 1081, in some embodiments, a material that can take up oxygen and/or moisture is formed within the enclosed space 1081.

The seal 1071 has a width W, which is its thickness in a direction parallel to a surface of the top or bottom substrate 1061, 1002 as shown in FIG. 5D. The width varies among embodiments and ranges from about 300 μm to about 3000 μm, optionally from about 500 μm to about 1500 μm. Also, the width may vary at different positions of the seal 1071. In some embodiments, the width of the seal 1071 may be the largest where the seal 1071 contacts one of the bottom and top substrate 1002, 1061 or a layer formed thereon. The width may be the smallest where the seal 1071 contacts the other. The width variation in a single cross-section of the seal 1071 relates to the cross-sectional shape of the seal 1071 and other design parameters.

The seal 1071 has a height H, which is its thickness in a direction perpendicular to a surface of the top or bottom substrate 1061, 1002 as shown in FIG. 5D. The height varies among embodiments and ranges from about 2 μm to about 30 μm, optionally from about 10 μm to about 15 μm. Generally, the height does not significantly vary at different positions of the seal 1071. However, in certain embodiments, the height of the seal 1071 may vary at different positions thereof.

In the illustrated embodiment, the seal 1071 has a generally rectangular cross-section. In other embodiments, however, the seal 1071 can have other various cross-sectional shapes such as a generally square cross-section, a generally trapezoidal cross-section, a cross-section with one or more rounded edges, or other configuration as indicated by the needs of a given application. To improve hermeticity, it is generally desired to increase the interfacial area where the seal 1071 directly contacts the bottom or top substrate 1002, 1061 or a layer formed thereon. In some embodiments, the shape of the seal can be designed such that the interfacial area can be increased.

The seal 1071 can be arranged immediately adjacent the OLED array 1021, and in other embodiments, the seal 1071 is spaced some distance from the OLED array 1021. In certain embodiment, the seal 1071 comprises generally linear segments that are connected together to surround the OLED array 1021. Such linear segments of the seal 1071 can extend, in certain embodiments, generally parallel to respective boundaries of the OLED array 1021. In other embodiment, one or more of the linear segments of the seal 1071 are arranged in a non-parallel relationship with respective boundaries of the OLED array 1021. In yet other embodiments, at least part of the seal 1071 extends between the top plate 1061 and bottom plate 1002 in a curvilinear manner.

As noted above, in certain embodiments, the seal 1071 is formed using a frit material or simply "frit" or "glass frit," which includes fine glass particles. The frit particles includes one or more of magnesium oxide (MgO), calcium oxide (CaO), barium oxide (BaO), lithium oxide ($Li_2O$), sodium oxide ($Na_2O$), potassium oxide ($K_2O$), boron oxide ($B_2O_3$), vanadium oxide ($V_2O_5$), zinc oxide (ZnO), tellurium oxide ($TeO_2$), aluminum oxide ($Al_2O_3$), silicon dioxide ($SiO_2$), lead oxide (PbO), tin oxide (SnO), phosphorous oxide ($P_2O_5$), ruthenium oxide ($Ru_2O$), rubidium oxide ($Rb_2O$), rhodium oxide ($Rh_2O$), ferrite oxide ($Fe_2O_3$), copper oxide (CuO), titanium oxide ($TiO_2$), tungsten oxide ($WO_3$), bismuth oxide ($Bi_2O_3$), antimony oxide ($Sb_2O_3$), lead-borate glass, tin-phosphate glass, vanadate glass, and borosilicate, etc. In embodiments, these particles range in size from about 2 μm to about 30 μm, optionally about 5 μm to about 10 μm, although not limited only thereto. The particles can be as large as about the distance between the top and bottom substrates 1061, 1002 or any layers formed on these substrates where the frit seal 1071 contacts.

The frit material used to form the seal 1071 can also include one or more filler or additive materials. The filler or additive materials can be provided to adjust an overall thermal expansion characteristic of the seal 1071 and/or to adjust the absorption characteristics of the seal 1071 for selected frequencies of incident radiant energy. The filler or additive material(s) can also include inversion and/or additive fillers to adjust a coefficient of thermal expansion of the frit. For example, the filler or additive materials can include transition metals, such as chromium (Cr), iron (Fe), manganese (Mn), cobalt (Co), copper (Cu), and/or vanadium. Additional materials for the filler or additives include $ZnSiO_4$, $PbTiO_3$, $ZrO_2$, eucryptite.

In embodiments, a frit material as a dry composition contains glass particles from about 20 to 90 about wt %, and the remaining includes fillers and/or additives. In some embodiments, the frit paste contains about 10-30 wt % organic materials and about 70-90% inorganic materials. In some embodiments, the frit paste contains about 20 wt % organic materials and about 80 wt % inorganic materials. In some embodiments, the organic materials may include about 0-30 wt % binder(s) and about 70-100 wt % solvent(s). In some embodiments, about 10 wt % is binder(s) and about 90 wt % is solvent(s) among the organic materials. In some embodiments, the inorganic materials may include about 0-10 wt % additives, about 20-40 wt % fillers and about 50-80 wt % glass powder. In some embodiments, about 0-5 wt % is additive(s), about 25-30 wt % is filler(s) and about 65-75 wt % is the glass powder among the inorganic materials.

In forming a frit seal, a liquid material is added to the dry frit material to form a frit paste. Any organic or inorganic solvent with or without additives can be used as the liquid material. In embodiments, the solvent includes one or more organic compounds. For example, applicable organic compounds are ethyl cellulose, nitro cellulose, hydroxyl propyl cellulose, butyl carbitol acetate, terpineol, butyl cellusolve, acrylate compounds. Then, the thus formed frit paste can be applied to form a shape of the seal 1071 on the top and/or bottom plate 1061, 1002.

In one exemplary embodiment, a shape of the seal 1071 is initially formed from the frit paste and interposed between the top plate 1061 and the bottom plate 1002. The seal 1071 can in certain embodiments be pre-cured or pre-sintered to one of the top plate and bottom plate 1061, 1002. Following assembly of the top plate 1061 and the bottom plate 1002 with the seal 1071 interposed therebetween, portions of the seal 1071 are selectively heated such that the frit material forming the seal 1071 at least partially melts. The seal 1071 is then allowed to resolidify to form a secure joint between the top plate 1061 and the bottom plate 1002 to thereby inhibit exposure of the enclosed OLED pixel array 1021 to oxygen or water.

In embodiments, the selective heating of the frit seal is carried out by irradiation of light, such as a laser or directed infrared lamp. As previously noted, the frit material forming the seal 1071 can be combined with one or more additives or filler such as species selected for improved absorption of the irradiated light to facilitate heating and melting of the frit material to form the seal 1071.

Figure 5E:
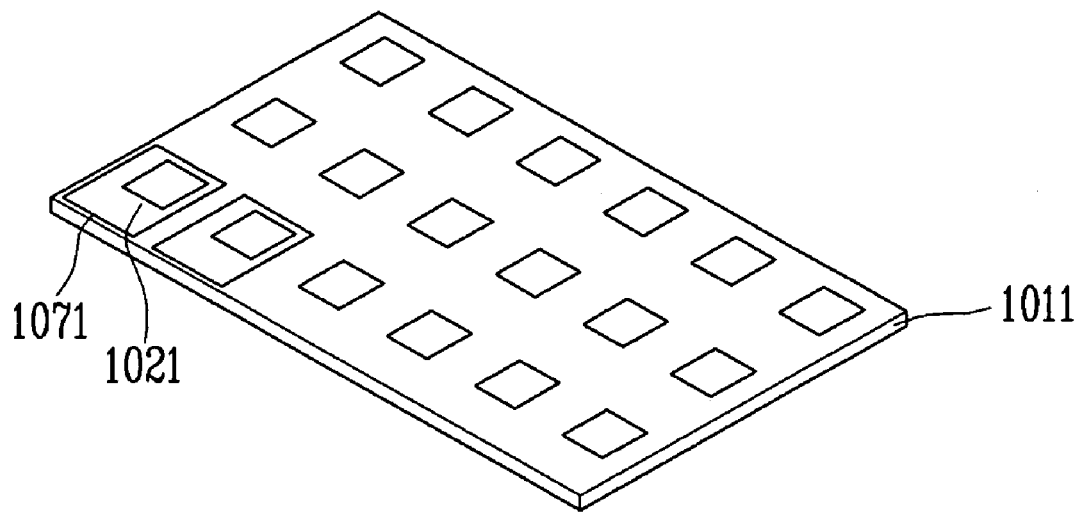
FIG. 5E is a schematic perspective view illustrating mass production of organic light emitting devices in accordance with one embodiment.

In some embodiments, OLED devices 1011 are mass produced. In an embodiment illustrated in FIG. 5E, a plurality of separate OLED arrays 1021 is formed on a common bottom substrate 1101. In the illustrated embodiment, each OLED array 1021 is surrounded by a shaped frit to form the seal 1071. In embodiments, common top substrate (not shown) is placed over the common bottom substrate 1101 and the structures formed thereon such that the OLED arrays 1021 and the shaped frit paste are interposed between the common bottom substrate 1101 and the common top substrate. The OLED arrays 1021 are encapsulated and sealed, such as via the previously described enclosure process for a single OLED display device. The resulting product includes a plurality of OLED devices kept together by the common bottom and top substrates. Then, the resulting product is cut into a plurality of pieces, each of which constitutes an OLED device 1011 of FIG. 5D. In certain embodiments, the individual OLED devices 1011 then further undergo additional packaging operations to further improve the sealing formed by the frit seal 1071 and the top and bottom substrates 1061, 1002.

Figure 1:
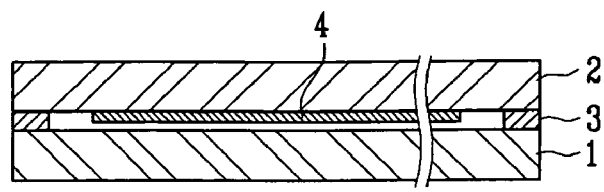
FIG. 1 is a cross-sectional view of an organic light-emitting display device.

One problem of the organic light-emitting display device is that the device can be deteriorated when moisture contacts organic materials constituting organic light-emitting elements. FIG. 1 is a cross-sectional view showing encapsulating structure that can prevent moisture from containing organic materials. In the illustrated structure, the organic light-emitting display device includes a substrate 1, an encapsulation substrate 2, an sealing member 3 and moisture absorbent 4. The substrate 1 includes at least one organic light-emitting diode (not shown), and the encapsulation substrate 2 is attached to the substrate 1 to oppose the organic light-emitting diode formed on the substrate 1.

In order to attach the substrate 1 to the encapsulation substrate 2, The sealing material 3 is applied along the edge of the substrate 1 and the encapsulation substrate 2, and the sealing material is cured using UV irradiation, etc. The moisture absorbent 4 is included within the encapsulation substrate 2 for removing them for capturing moisture and certain gases such as hydrogen, oxygen. Even in the illustrated device, however, the sealing material 3 may not completely prevent moisture or air entering into the enclosed space. Also, there may be cracks in the sealing material 3 and in the interfacial area where the sealing material 3 contacts the substrate for various reasons.

The organic light emitting display device has a gap between the top surface of the array and the inner surface of the top substrate. Generally, the size of the gap depends on the height of the seal interconnecting two substrates. A frit seal, among other forms of sealing, allows the gap size significantly smaller than others. For example, when using the frit seal, the gap size (the distance between the array and the second substrate) can be in the order of a few μm to several hundred μm. When the gap size is in this range, dark rings called Newton rings may be formed on the display surface due to optical interference created by light incident to the display surface. More specifically, when the gap size is about or less than 10 μm, the possibility of Newton rings may increase. Thus, in packaging an organic light emitting display device with the frit seal, the configuration for avoiding Newton rings can be a design factor.

Figure 2:
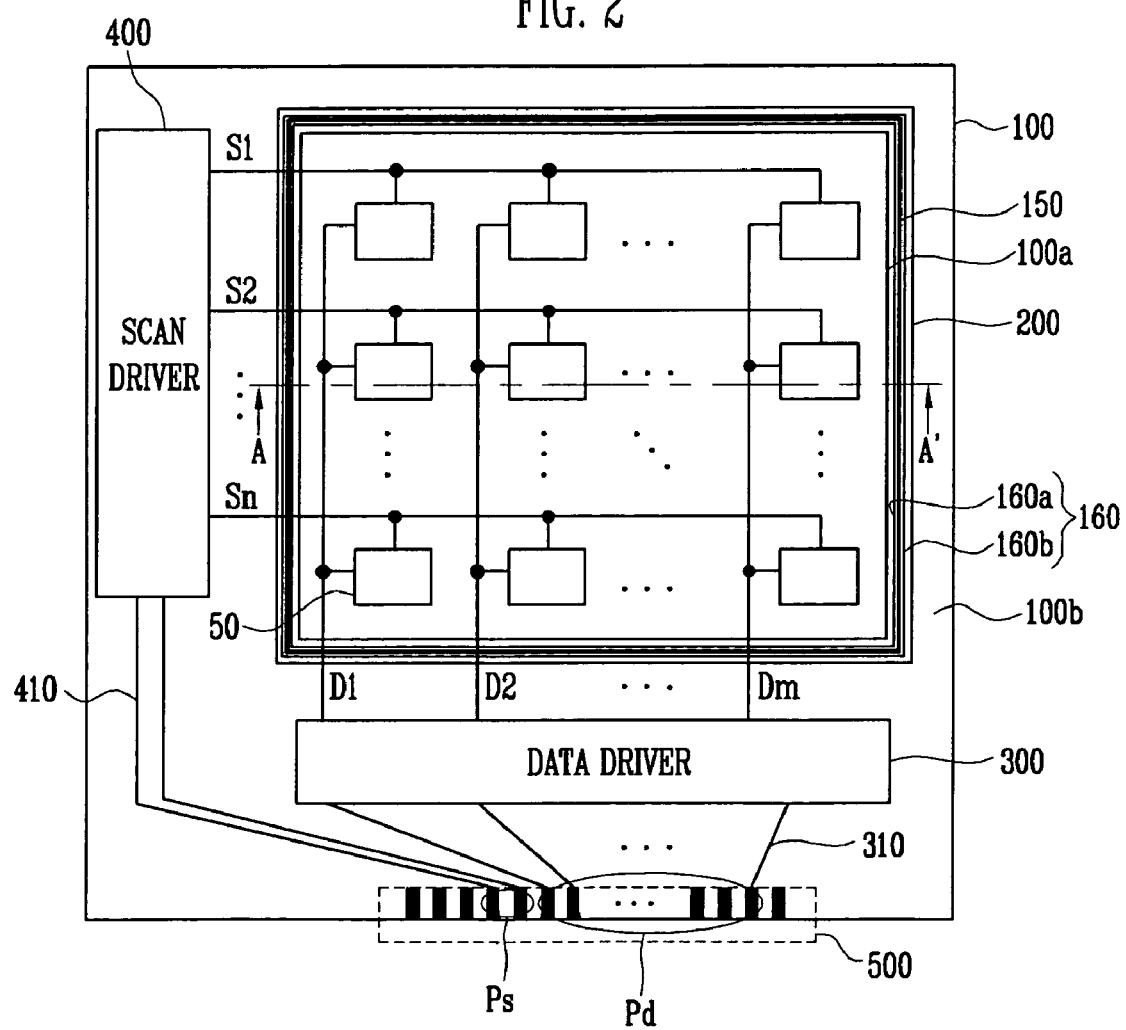
FIG. 2 is a plan view of an organic light-emitting display device according to one embodiment of the present invention.
Figure 3:
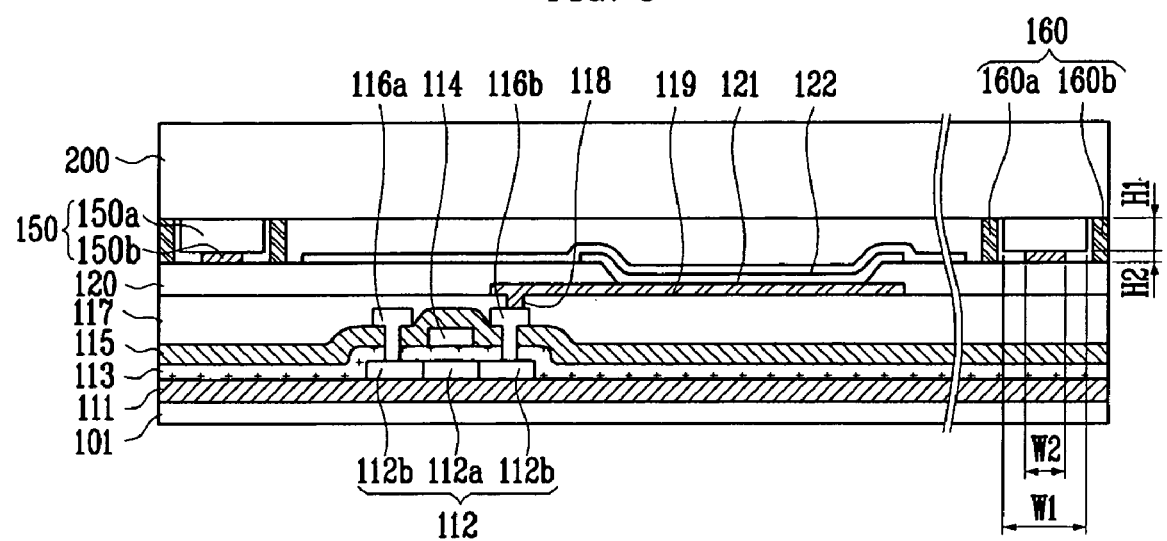
FIG. 3 is a cross-sectional view of an organic light-emitting display device taken along A-A' line in FIG. 2.

FIG. 2 is a plan view of an organic light-emitting display device according to an embodiment of the present invention and FIG. 3 is a cross-sectional view of an organic light-emitting display device taken along the A-A' line of FIG. 2. According to this, an organic light-emitting display device comprises a bottom substrate 100, an encapsulation or top substrate 200, encapsulating or sealing member 150 and supplement material or structure 160. For the sake of convenience, the deposition substrate 101 refers to a base, on which circuits and layers are formed, and the substrate 100 refers to an unfinished product including the deposition substrate 101 and circuits and layers formed thereon, including an array of organic light emitting pixels.

The substrate 100, which is a plate including organic light-emitting diodes or pixels, comprises a pixel region 100a in which at least one organic light-emitting configured of a first electrode 119, an organic layer 121 and a second electrode 122 is formed, and a non-pixel region 100 formed outside the pixel region 100a. In the explanation of the following specification, the pixel region 100a means a region in which a predetermined image is displayed by light emitted from the organic light-emitting diode, and the non-pixel region 100b means all regions other than the pixel region 100a on the substrate 100.

The pixel region 100a includes a plurality of scan lines (S1 to Sm) arranged in a row direction and a plurality of data lines (D1 to Dm) arranged in a column direction, and a plurality of pixels receiving a signal from a driver integrated circuit 300, 400 for driving the organic light-emitting diode are formed in the scan lines (S1 to Sm) and the data lines (D1 to Dm). Also, in the non-pixel region 100b driver ICs 300 and 400 for driving the organic light-emitting diode; a scan supplying line 410 and a data supplying line 310 electrically connected to the scan lines (S1 to Sm) and the data lines (D1 to Dm) of the pixel region, respectively; and a power line (not shown), etc. are formed. The data driver 300, which can be mounted on the substrate 100 by being prepared in the form of a chip, is electrically connected to a second pad Pd of a pad part 500. Such a data driver 300 receives a signal from the second pad Pd through the data supplying line 310 and transmits the data signal to a plurality of data lines (D1,D2, . . . Dm). The scan driver 400 is formed to be adjacent to one side of the pixel region 100a and is electrically connected to a first pad Ps of the pad part 500 through the scan supplying line 410. Such a scan driver 400 receives a signal from the first pad Ps through the scan supplying line 410 and supplies the scan signal to a plurality of scan lines (S1,S2, . . . Sn) in sequence. The pad part 500 supplies a driving power to the data driver 300 through the data supplying line 310 and supplies the driving power to the scan driver 400 through the scan supplying line 410.

Meanwhile, the drawings illustrate the case that the data driver 300, the scan driver 400 and the pad part 500 are not encapsulated since the encapsulating member 150 are applied along the outer of the pixel region 100a, however, the present invention is not limited thereto and the encapsulating member 150 can be applied along the all outers of the data driver 300, the scan driver 400 and the pad part 500 according to designs. In this case, the size of the encapsulation substrate 200 will be also prepared in size capable of sealing all sides of the substrate 100. The organic light-emitting display device is illustrated to be driven in an active matrix approach in the present drawings, therefore, the structure thereof will be schematically explained.

A buffer layer 111 is formed on a base substrate 101, and the buffer layer 111 is made of insulating material such as silicon oxide SiO2 or silicon nitride Sinx, etc. The buffer layer 111 is formed to prevent the substrate 100 from damaging due to factors such as heat from outside, etc. On at least any one region of the buffer layer 111 a semiconductor layer 112 comprising an active layer 112a and an ohmic contact layer 112b is formed. On the semiconductor layer 112 and the buffer layer 111 a gate insulating layer 113 is formed, and on one region of the gate insulating layer 113 a gate electrode 114 having the size corresponding to the width of the active layer 112 is formed. An interlayer insulating layer 115 is formed on the gate insulating layer 113 including the gate electrode 114, and source and drain electrodes 116a, 116b are formed on a predetermined region on the interlayer insulating layer 115.

The source and drain electrodes 116a, 116b are formed to connect to one region in which the ohmic contact layer 112b is exposed, respectively, and a planarization layer 117 is formed on the interlayer insulating layer 115 including the source and drain electrodes 116a, 116b. On one region of the planarization layer 117 a first electrode 119 is formed and at this time, the first electrode 119 is connected to one region exposed to any one of source and drain electrodes 116a, 116b by means of a via hole 118. On the planarization layer 117 including the first electrode 119 a pixel defined film 120 having an opening part (not shown) exposing at least one region of the first electrode 119 is formed. On the opening part of the pixel defined film 120 an organic layer 121 is formed, and on the pixel defined film 120 including the organic layer 121 a second electrode layer 122 is formed and at this time, a passivation layer can be further formed on the upper part of the second electrode layer 122. Merely, the active type matrix structure or the passive matrix structure of the organic light-emitting diode can variously be modified and the respective general structures have been well known, and therefore, the detailed explanation thereof will be omitted.

The encapsulation or top substrate 200, which is attached to the substrate 100 for encapsulating the organic light-emitting diodes formed on the substrate 100, can be made of transparent material in the case of front side light-emitting type or both sides light-emitting type of the OLED device, and be made of opaque material in the case of rear side light-emitting type of the OLED device. Although not limited thereto, in an embodiment, glass can be used in the case of the front side light-emitting type. The encapsulation substrate 200 is configured as a plate-type in an embodiment, and the encapsulation substrate 200 seals the region including the pixel region 100a in which the organic light-emitting diode of the substrate is formed.

The sealing material or member 150, which is formed in the space or gap between the encapsulation substrate 200 and the non-pixel region 100b of the substrate 100, encapsulates the pixel region 100a so that air or moisture cannot move into, and, in an embodiment, forms a line spaced from an edge of the side. This provides a space to form second sealing member 160 to be described later.

In some embodiments, the encapsulating member 150 comprises a first frit layer 150a and a second frit layer 150b integrated with the first frit layer 150a. The second frit layer 150b melts substantially easier than the first frit layer 150a upon irradiation of a laser or infrared beam thereto. In one embodiment, when all other conditions are the same, the composition of materials forming the second frit layer 150b is to melt quicker than the composition of materials forming the first frit layer 150a. For example, the time required to start the second frit layer 150b to melt is about 10, 20, 30, 40, 50, 55, 60, 65, 70, 75, 80 or 90% of the time required to start the first frit layer 150a to melt. In another embodiment, when all other conditions are the same, the composition of materials forming the second frit layer 150b is to melt at a less powerful beam than the composition of materials forming the first frit layer 150a. For example, the energy of the laser or infrared beam required to start the second frit layer 150b to melt is about 10, 20, 30, 40, 50, 55, 60, 65, 70, 75, 80 or 90% of the energy of the beam required to start the first frit layer 150a to melt when applied for the same period of time. In an embodiment, the first frit layer 150a may be transparent and the second frit layer 150b may be opaque. The first frit layer 150a, which is transparent, for example, made of silicon oxide SiO2, functions as a spacer for controlling the gap or space between the substrate 100 and the encapsulation substrate 200 and accordingly, keeps the gap distance between the substrate 100 and the encapsulation substrate 200 constant, thereby, preventing the generation of a Newton's ring phenomenon. The Newton's ring phenomenon is a phenomenon that the pattern of a concentric circle from a contact point of the substrate may be formed due to an optical interference phenomenon and such a pattern of a concentric circle may be displayed on a display surface. When the space between the substrate 100 and the encapsulation substrate 200 becomes narrow in the organic light-emitting display device, the light reflected in the respective substrate 100 and the encapsulation substrate 200 causes the interference phenomenon, generating the Newton's ring phenomenon. In one embodiment, the first frit layer 150a prevents a generation of the Newton's ring phenomenon by providing the gap distance between the substrate 100 and the encapsulation substrate 200 greater than a certain gap distance which may generate Newton's ring.

The second frit layer 150b, comprising absorbent capable of absorbing energy of laser or infrared rays, melts between the encapsulation substrate 200 and the substrate 100 by absorbing the irradiated energy, bonding the encapsulation substrate 200 to the substrate 100. That is, when laser or infrared rays are irradiated to the encapsulating member 150, the transparent first frit layer 150a allows the laser or the infrared rays to pass through and the second frit layer 150b melts and cured by using the irradiation of the laser or the infrared rays, thereby encapsulating the space between the substrate 100 and the encapsulation substrate 200.

In the illustrated embodiment, the reason why the encapsulating member 150 is configured of a double layer as above is to improve efficiency of the irradiation of laser of infrared rays. In certain embodiments, the height H1 of the first frit layer 150a is from about 5 μm to about 100 μm, and height H2 of the second frit layer 150b is from about 3 μm to about 5 μm, although not limited thereto. In an embodiment, it is that the width W2 of the second frit layer is formed to be smaller than the width W1 of the first frit layer. In an embodiment, the width W1 of the first frit layer is from about 0.5 mm to about 1.5 mm. Meanwhile, in one embodiment, the region on the substrate on which the encapsulating member 150 is formed is not overlapped with metal wiring. Since the encapsulating member 150 is irradiated with laser or infrared rays as described above, the metal wiring may be damaged when the encapsulating member 150 is overlapped with the metal wiring.

The supplementary material or structure 160, which is formed on the outer side, the inner side, or the both sides of the encapsulating member 150, prevents the organic light-emitting display device from easily breaking, in particular, when all the substrate 100, the encapsulation substrate 200 and the encapsulating member 150 are glass. The supplement material serves as an additional sealing member, in particular, when the encapsulating member 150 is damaged by being melted and its adhesion is weaken. The supplement material 160 can be apart from the encapsulating member 150 at a predetermined interval or contact to the encapsulating member 150. As material of the supplement material 160, resins which are naturally cured, thermally cured or UV cured by being applied in liquid state, can be used. For example, acrylate cyanide as material to be naturally cured, acrylate as material to be thermally cured at a temperature less than 80° C. and epoxy, acrylate and urethane acrylate as material to be UV cured can be used. Although the width of the supplement material is associated with the width of the encapsulating member, and in an embodiment, it is from about 0.3 mm to about 0.7 mm as described above.

Figure 4A:
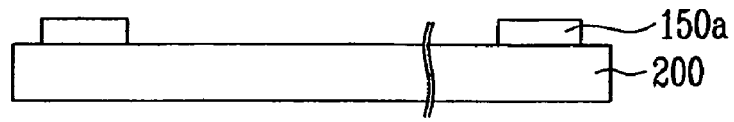
FIG. 4a to FIG. 4h are cross-sectional views for showing a preparing process of an organic light-emitting display device according to an embodiment of the present invention.
Figure 4B:
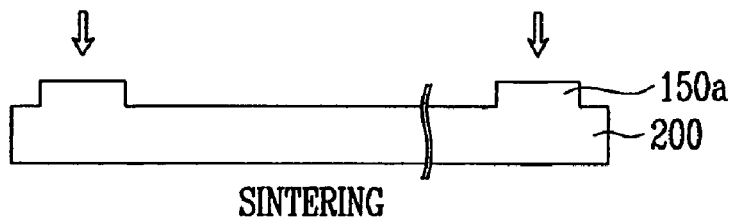
Figure 4C:
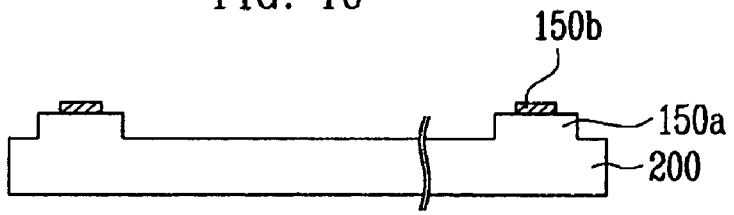

Hereinafter, a method of packaging the organic light-emitting display device according to an embodiment will be explained. FIG. 4a to FIG. 4e are views for illustrating steps of the process of making the organic light-emitting display device. The first frit layer 150a of transparent material is formed on one region of the encapsulation substrate 200. The first frit layer 150a can be applied with a dispenser or a screen printing method. (FIG. 4a) Next, the first frit layer 150a is baked at a predetermined temperature. In one embodiment, the temperature for baking the first frit layer 150a is from about 450° C. to about 600° C. After baking process of the first frit layer 150a, the interfaces of the encapsulation substrate 200 and the first frit layer 150a are bonded. (FIG. 4b)

Figure 4D:
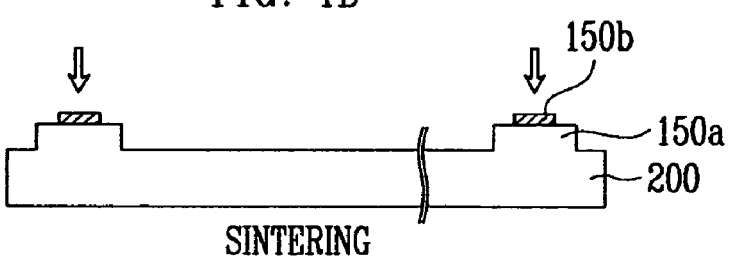
Figure 4E:
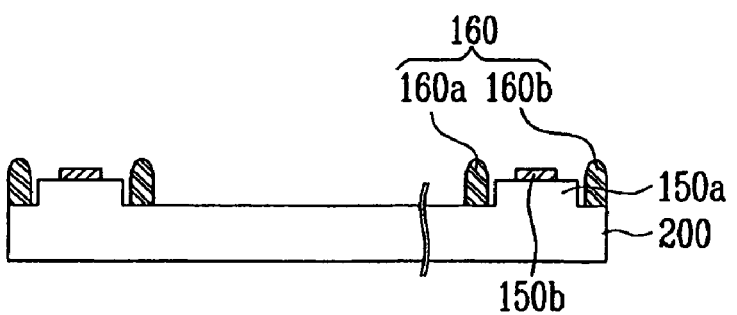

Next, the second frit layer 150b of opaque material is applied to one region on the first frit layer 150a. In certain embodiments, the width of the second frit layer 150b can be identical or narrower than that of the first frit layer 150a. The second frit layer 150b can be applied in the same manner as in the first frit layer. (FIG. 4c) Next, the second frit layer 150b is baked at a predetermined temperature. In one embodiment, the second frit layer 150b may be baked in the same range of temperature with the baking of the first frit layer 150a. After baking process, the first frit layer 150a, the encapsulation substrate 200 and the second frit layer 150b are integrated. (FIG. 4d)

Figure 4F:
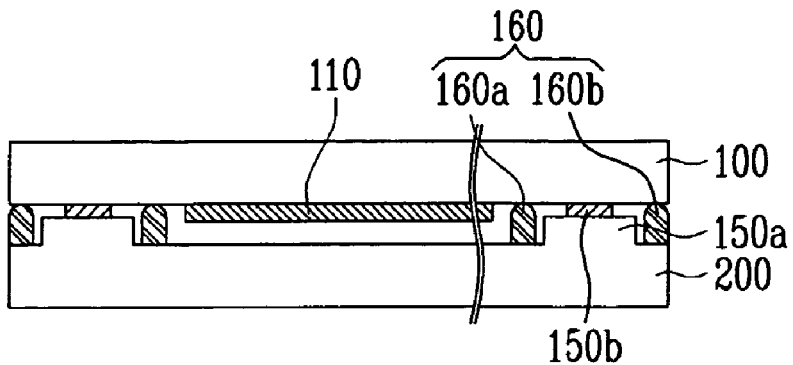

Next, the supplement material is applied to the substrate 200 at the inner side or the outer side, or to the both sides. In the illustrated embodiment, the supplement member 160a and 160b are formed on both the inner side and the outer side. In an embodiment, the supplement material 160 is resin material to be cured in the step described below. (FIG. 4e) Next, the substrate 100 is bonded to the encapsulation substrate 200. In one embodiment, the substrate 100 comprises the pixel region in which the organic light-emitting diode is formed and the non-pixel region including regions other than the pixel region, and the encapsulation substrate 200 is bonded to the substrate to seal the pixel region of the substrate. (FIG. 4f)

Figure 4G:
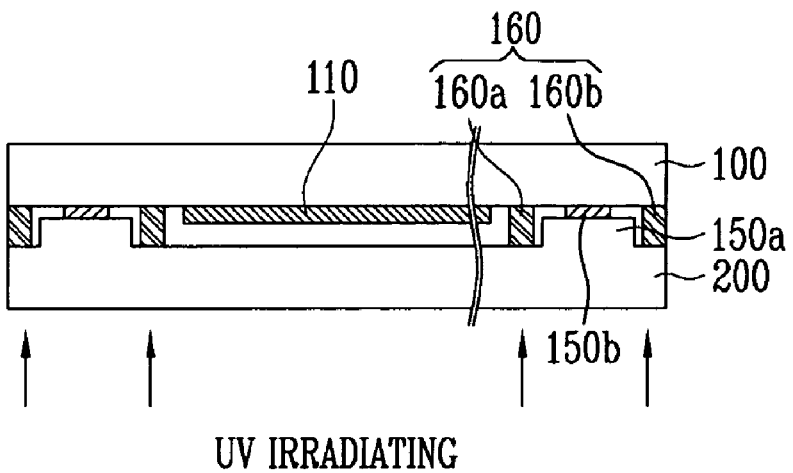
Figure 4H:
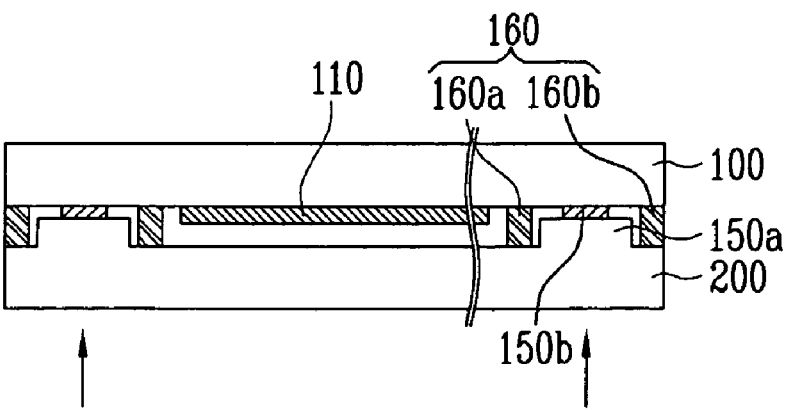

Next, the supplement material 160 is heated or irradiated by ultraviolet rays to be cured, primarily bonding the encapsulation substrate 200 to the substrate 100. (FIG. 4g) Next, the encapsulating member 150 is irradiated with laser or infrared rays and the second frit layer of the encapsulating member 150 is melted by absorbing the energy of laser or infrared rays. Thereafter, the second frit layer 150b melted is cured, thereby bonding the encapsulation substrate 200 to the substrate 100. In one embodiment, it is that in the laser or the infrared rays to be irradiated, for example, the wavelength thereof is from about 800 to about 1200 nm (preferably, about 810 nm), the output thereof is from about 25 to about 45 watt and the parts other than the frit is to be masked. Meanwhile, although the encapsulating member 150 formed on the encapsulation substrate 200 is explained, although is not limited thereto. The encapsulating member 150 can be formed on the substrate 100. Also, although the second frit layer 150b formed on the first frit layer 150a so that laser or infrared rays can be irradiated to the second frit layer 150b and laser or infrared rays pass through the first frit layer 150a is explained, the positions of the first frit layer 150a and the second frit layer 150 may be changed.

Although embodiments of the present invention have been shown and described, it would be appreciated by those skilled in the art that changes might be made in this embodiment without departing from the principles and spirit of the invention, the scope of which is defined in the claims and their equivalents. For example, each of the first frit layer and the second frit layer may be formed to have a plurality of layers. Further, the laser or the infrared rays may be irradiated to the side of the substrate or its opposite side.

What is claimed is:

1. A method of making an organic light emitting display device, the method comprising:
   providing a first substrate and a first fit bonded to the first substrate;
   providing a second substrate and an array of organic light emitting pixels formed on the second substrate, the second substrate made of a single layer or multiple layers;
   arranging the first substrate and the second substrate so as to oppose each other and interpose the array therebetween;
   interposing a second frit between the first frit and the second substrate, the second fit forming a closed loop surrounding the array, the second fit is configured to melt substantially easier than the first frit upon irradiation of a laser or infrared beam thereto; and
   bonding the second frit to the first frit and to the second substrate, thereby forming an integrated frit seal interposed between the first and second substrate wherein the frit seal, the first substrate and the second substrate together define an enclosed space in which the array is located;
   wherein the second frit is substantially non-transparent.

2. The method of claim 1, wherein interposing the second fit comprises placing the second frit on the first frit.

3. The method of claim 1, wherein bonding comprises melting and solidifying at least part of the second frit.

4. The method of claim 1, wherein the first frit melts substantially less than the second frit.

5. The method of claim 1, wherein each of the first and second frits comprises a light-to-heat conversion material configured to generate heat upon receiving the laser or infrared beam, and wherein the second frit comprises an amount of the light-to-heat conversion material substantially more than the first frit.

6. The method of claim 1, wherein the second frit comprises a light-to-heat conversion material configured to generate heat upon receiving the laser or infrared beam, and wherein the first frit is substantially free of light-to-heat conversion material.

7. The method of claim 1, wherein the first frit is substantially transparent.

8. The method of claim 1, wherein the first frit comprises a first end facing the second substrate, the second frit comprises a second end facing the first substrate, wherein the first end has a first width perpendicular to the shortest imaginary line interconnecting the first and second substrates in a plane perpendicular to an elongation of the frit seal, and wherein the second end has a second width in the same direction, wherein the first width is greater than the second width.

9. The method of claim 1, wherein the first frit comprises a first end facing the second substrate, the second frit comprises a second end facing the first substrate, wherein the first frit has a first height from the first substrate to the first end in a direction parallel to the shortest imaginary line interconnecting the first and second substrates in a plane perpendicular to an elongation of the fit seal, wherein the second fit has a second height from the second substrate to the second end in the same direction, wherein the first height is greater than the second height.

10. The method of claim 1, wherein providing the first substrate and the first frit comprises bonding the first frit to the first substrate.

11. The method of claim 10, wherein bonding comprises baking the first substrate and the first frit in contact with the first substrate, whereby at least part of the first frit melts and solidifies so as to bond to the first substrate.

12. The method of claim 1, wherein the array and the first substrate form a gap therebetween.

13. The method of claim 1, wherein the first fit has a volume substantially greater than that of the second frit.

14. The method of claim 1, further comprising forming a structure extending along at least part of the frit seal, wherein the structure is interposed between and interconnects the first and second substrates, and wherein the structure is located outside or inside the enclosed space.

15. The method of claim 14, wherein forming the structure comprises:
    interposing a curable material between the first and second substrates; and
    curing the curable material thereby forming the structure interconnecting the first and second structures.

16. The method of claim 1, further comprising forming a first structure and a second structure, each of which is interposed between and interconnects the first and second substrates, wherein the first structure extends along the frit seal inside the enclosed space, and wherein the second structure extends along the frit seal outside the enclosed space.

17. The method of claim 1, further comprising forming a structure extending along the frit seal and located inside or outside the enclosed space, wherein the structure comprises a portion interposed between and interconnects the first substrate and the second substrate.

18. The method of claim 17, wherein forming the structure comprises:
    interposing a curable material between the first substrate and the second substrate; and
    curing the curable material thereby forming the structure interconnecting the first substrate and the second structure.

19. The method of claim 1, further comprising forming a first structure and a second structure, each of which extends along the frit seal inside or outside the enclosed space, wherein the first structure is interposed between and interconnects the first and second substrates.

20. The method of claim 1, wherein each of the first and second frits comprises one or more materials selected from the group consisting of magnesium oxide (MgO), calcium oxide (CaO), barium oxide (BaO), lithium oxide ($Li_2O$), sodium oxide ($Na_2O$), potassium oxide ($K_2O$), boron oxide ($B_2O_3$), vanadium oxide ($V_2O_5$), zinc oxide (ZnO), tellurium oxide ($TeO_2$), aluminum oxide ($Al_2O_3$), silicon dioxide ($SiO_2$), lead oxide (PbO), tin oxide (SnO), phosphorous oxide ($P_2O_5$), ruthenium oxide ($Ru_2O$), rubidium oxide ($Rb_2O$), rhodium oxide ($Rh_2O$), ferrite oxide ($Fe_2O_3$), copper oxide (CuO), titanium oxide ($TiO_2$), tungsten oxide ($WO_3$), bismuth oxide ($Bi_2O_3$), antimony oxide ($Sb_2O_3$), lead-borate glass, tin-phosphate glass, vanadate glass, and borosilicate.

* * * * *